United States Patent [19]

Mori

[11] Patent Number: 4,600,973
[45] Date of Patent: Jul. 15, 1986

[54] LIGHT SOURCE DEVICE

[76] Inventor: Kei Mori, 3-16-3-501, Kaminoge, Setagaya-ku, Tokyo, Japan

[21] Appl. No.: 699,758

[22] Filed: Feb. 8, 1985

[30] Foreign Application Priority Data

Feb. 10, 1984 [JP] Japan .................................. 59-23594

[51] Int. Cl.[4] .............................................. F21V 7/04
[52] U.S. Cl. ...................................... 362/32; 362/35; 362/287; 362/419; 362/805
[58] Field of Search ................... 362/32, 35, 269, 271, 362/275, 287, 419, 423, 217, 220, 272, 285, 382, 427, 428, 805

[56] References Cited

U.S. PATENT DOCUMENTS 3,040,993  6/1962  Schultz ................................ 362/269
4,160,285  7/1979  Shibla ................................. 362/275
4,464,705  8/1984  Horowitz .............................. 362/32

FOREIGN PATENT DOCUMENTS 1293845  4/1962  France ................................ 362/269

Primary Examiner—Charles J. Myhre
Assistant Examiner—David A. Okonsky
Attorney, Agent, or Firm—Jordan and Hamburg

[57] ABSTRACT

A light source device which employs light energy transmitted through an optical conductor cable as a photo-synthesizing light source for cultivating plants. The light energy emitted from the optical conductor cable is effectively dispersed in order to nurture plants. The light source device is comprised of a hollow cylinder, a rotating support member for supporting the cylinder which rotates around a first axis perpendicular to the axis of the cylinder, a fixed supporting member for supporting the rotating support member which rotates around a second axis intersecting with the axis of the cylinder and another axis perpendicular to that of the cylinder, and a driving mechanism for rotating the cylinder around the first axis and the second axis at the edge portion of the cylinder, and an optical conductor cable inserted into the cylinder at a place near to the first axis, the edge portion surface of which is elongated to the other edge portion of the cylinder.

12 Claims, 10 Drawing Figures

LIGHT SOURCE DEVICE

BACKGROUND OF THE INVENTION

The present invention relates to a light source device, in particular, a light source device in which, in the case of employing the light energy transmitted through an optical conductor cable as a photo-synthesizing light source for cultivating plants, the light energy emitted from the above-mentioned optical conductor is dispersed effectively so as to nurture plants more effectively.

In order to effectively nurture plants, a proper amount of nutritious substances, light rays, carbon-dioxide, water, the proper temperature, humidity and so on are necessary. However, it is often difficult to satisfy all of them in the right proportions. Furthermore, in order to nurture plants, a ground is needed as a home for plants. In urban districts as for instance a megalopolis, it is not readily easy to acquire a space for cultivating as for example, ground which is to be employed for cultivating plants. It is especially difficult to ensure ground that is exposed to sun so necessary for nuturing plants.

In order to solve such problems, the present applicant has previously proposed devices for focusing solar rays by means of a lense or the like and for guiding the solar rays into an optical conductor, and for further guiding them through an optical conductor to a plant cultivating device installed at an optional desired place so as to supply the necessary solar ray energy to the plants. Furthermore, the present applicant also proposed another plant cultivating device in which artificial light rays were to be added to the solar rays collected in such a manner as described above. (For instance, refer to the Japanese Patent Application No. 58-119866.) However, when light rays transmitted through an optical conductor are emitted from its edge surface, the expanding angle of the light rays' emission is narrow, for instance 45°, i.e. under normal conditions. Therefore, it is impossible to supply light energy over a wide area solely by emitting the light rays from an optical conductor.

By utilizing the light energy, plants perform a photo-synthesis process. The nutritious substances produced by the photo-synthesis are transferred to the trunk and fruit of plants. Such transfer can be effectively performed on the condition of no light rays to be given, existence of full oxygen, or low temperature. Namely, although it is necessary to perform a photo-synthesis reaction and to cause the transfer of the nutritious substances produced by it to the plants being nurtured, the brightness and darkness periods must be alternated. In other words, the brightness period (the photo-synthesizing period) and the darkness period (the transferring period) are preferably repeated at predetermined intervals, in order for the photo-synthesis reaction to be effectively carried out.

Furthermore, in the case of nurturing plants, if the light rays are supplied to the plants intermittently (i.e. approximately several $\mu s$ to several ms) instead of successively, the photo-synthesizing reaction will consist of a brightness reaction and a darkness reaction and the intensive light rays will be supplied to the plants during the brightness reaction period while the light rays will not be supplied or the weak light rays will be supplied to the plants during the darkness reaction period and the growth of the plants will be promoted as a matter of course.

When the light source device is moved so as to disperse the light rays, the utilization area of the light energy will be enlarged considerably compared with the opposite case of illuminating the plants by use of a fixed light source. When employing a light source of the same capacity, the plants will be cultivated over a wider area. Furthermore, in accordance with the movement of the light source device, the position of the shadow, caused by the front leaves, changes every minutes. Therefore the brightness reaction and the darkness reaction will be repeated at timed intervals so that the growth of the plants will be promoted more effectively.

Particularly, in the case of a light source device which involves light rays emitted from the edge surface of an optical conductor, the expanding angle of the light rays' emission from the light-emitting edge of the optical conductor is narrow, as mentioned before. Therefore, it may be possible to illuminate the plants over a wider area by means of the light rays emitted from the light-emitting edge of the optical conductor by moving the light-emitting edge of the optical conductor.

SUMMARY OF THE INVENTION

It is an object of the present invention to provide a light source device which employs light energy transmitted through an optical conductor cable as a photo-synthesizing light source for cultivating plants, the light energy emitted from the optical conductor cable is effectively dispersed in order to nurture plants.

Another object of the present invention is to provide a light source device in which the light rays transmitted through the optical conductor are effectively dispersed and supplied to plants so that plants can be more effectively cultivated over a wider area.

It is another object of the present invention to provide a light source device in which the light rays emitted from the edge surface of the optical conductor can be effectively dispersed and supplied to the plants.

The above-mentioned features and other advantages of the present invention will be apparent from the following detailed description which goes with the accompanying drawings.

DESCRIPTION OF THE PREFERRED EMBODIMENTS

Figure 1:
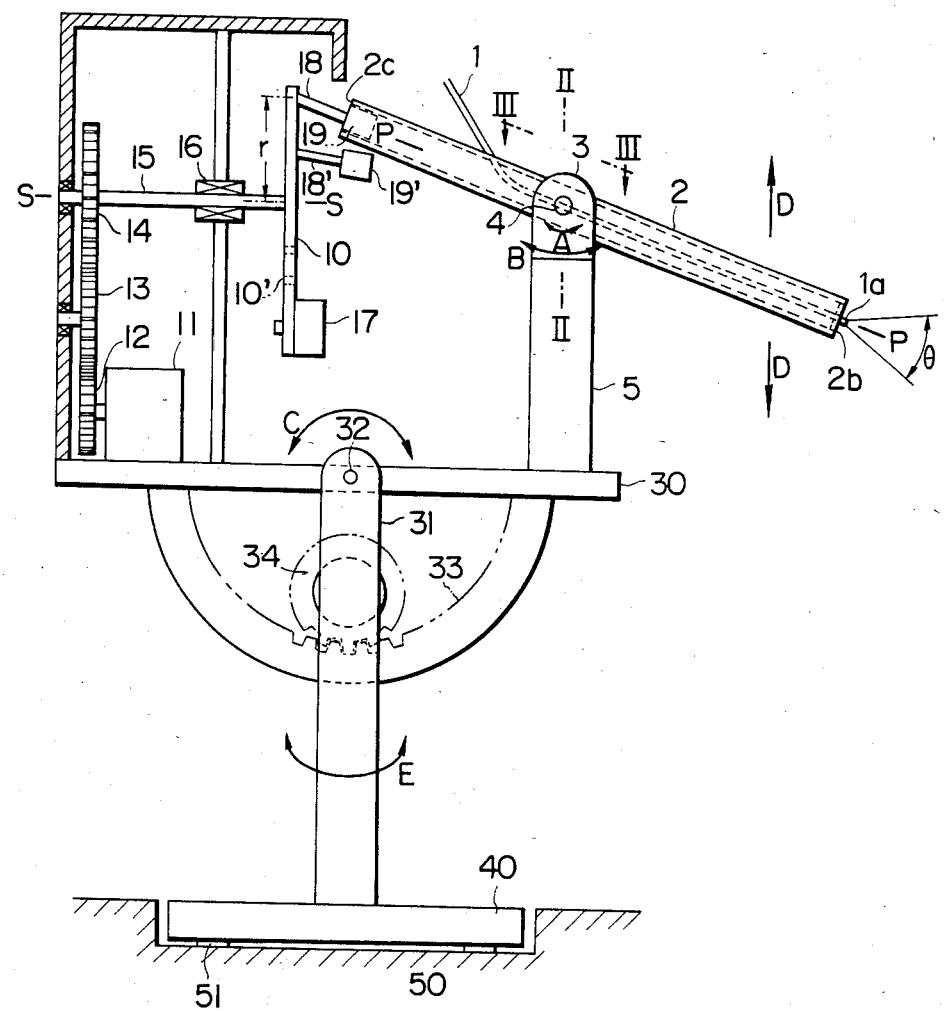
FIG. 1 is an entire constructional view for explaining an embodiment of the present invention.
Figure 2:
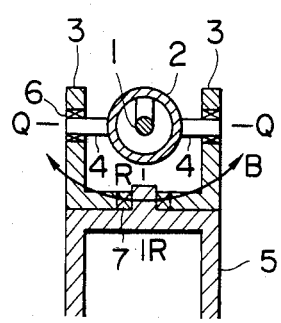
FIG. 2 is an enlarged cross-sectional view taken along section line II—II of FIG. 1.
Figure 3:
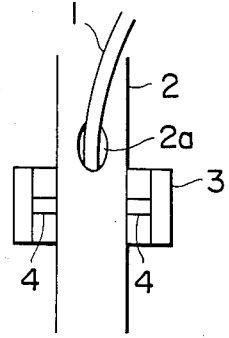
FIG. 3 is an enlarged view as seen from line III—III of FIG. 1.

FIG. 1 is a view of the plan pertaining to the embodiment of the light source device according to the present invention. FIG. 2 is an enlarged cross-sectional view taken along line II—II of FIG. 1. FIG. 3 is an enlarged view as seen from line III—III of FIG. 1. In those figures, 1 is an optical conductor cable for transmitting the light energy therethrough, the edge portion (not shown in the drawings) of which is positioned at the focal point of the lense for focusing the solar rays or the artificial light rays as previously proposed by the present applicant in various ways. The solar rays or the artificial light rays focused by the lense are guided into the optical conductor cable 1 and further transmitted therethrough, 2 is a hollow cylinder, 3 is a rotatable supporting pedestal, 4 is a pin for supporting the hollow cylinder 2 so as to rotate in the direction shown by arrow A in relation to the rotatable supporting pedestal 3, around the axis line Q—Q which is perpendicular to the axis line P—P of the cylinder 2, 5 is a fixed supporting member for supporting the rotating support member (the rotatable supporting pedestal 3) so as to rotate around the axis line R—R which intersects with the axis line P—P of the cylinder 2 and the axis line Q—Q which is perpendicular to the axis line P—P, and bearings 6 and 7. On the upper side of the cylinder 2, a hole 2a is bored at a place near the pin 4. The optical conductor cable 1 is guided into the cylinder 2 through hole 2a and further guided to edge portion 2b of cylinder 2 and then through it. The optical conductor cable is fixed to the cylinder 2 at the edge portion 2b thereof.

Although the light rays, transmitted through the optical conductor cable 1 in the manner mentioned before, are emitted from the edge surface 1a of the optical conductor cable 1, the expanding angle $\theta$ of the light emission is narrow, for instance 45°, under normal conditions. The other edge portion 2c of the cylinder 2 is connected with a rotating arm 10 through a connecting bar 18. The rotating arm 10 is driven by a motor 11 in such a manner that the rotation of the motor 11 is transmitted to the rotatable shaft 15 through gear mechanisms 12, 13 and 14, and the rotating arm 10 is rotated around the axis S—S by the shaft 15. Moreover, 16 is a bearing for rotatably supporting the shaft 15 and 17 is a balancing weight.

In such a construction, when the motor 11 rotates, the other edge portion 2c of the cylinder 2 performs a circular movement of the radius r (namely, the distance between the center of the shaft 15 and the junction point of the rotating arm 10 and the connecting bar 18) around the shaft 15, and the one edge portion 2b of the cylinder 2 also performs a circular movement following the movement of the edge portion 2c. Consequently, the light-emitting edge surface 1a of the optical conductor cable 1 performs a circular movement so that the light rays emitted from the light-emitting edge surface 1a of the optical conductor cable 1 can be moved.

Figure 4:
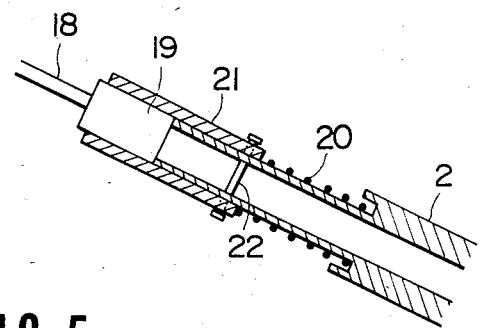
FIG. 4 is a cross-sectional construction view for showing an example of a joint portion used for connecting the cylinder 2 with the connecting bar 18 as shown in FIG. 1.

Moreover, 18 is a connecting bar which is unitarily mounted on the rotating arm 10 and connects the rotating arm 10 with the other edge portion 2c of the cylinder 2, and the connecting bar 18 has to be relatively rotatable against the cylinder 2 and around axis line P—P. For instance, as shown in FIG. 4, a circular cylindrical member 19 to be inserted slidably in cylinder 2 is connected with the tip end of the connecting bar 18 in such a manner that both circular cylindrical member 19 and cylinder 2 can be rotated together. Otherwise, instead of the circular cylindrical member 19, a bearing can be employed for enabling the rotational movement of the connecting bar 18 and the cylinder 2.

As mentioned before, the connecting bar 18 has to be rotatably connected with the cylinder 2. For this reason, the axis line of the connecting bar 18 should coincide with that of the cylinder 2, and the connecting bar 18 is mounted on the rotating arm 10 so as to be directed in the direction of the intersection of the pin 4's axis line, and the rotating support pedestal's 3 axis line. Furthermore, the tip end portion of the cylinder 2 is constructed so as to expand or contract freely in the direction of the arrow by means of a spring 20 or the like as shown in FIG. 4. In such a construction, the connecting and removal of the connecting bar 18 and the cylinder 2 can be done very easily. As shown in FIG. 4, when a movable member 21, located at the tip end of the cylinder 2, is contracted against the spring 20, the engagement of the circular cylindrical member 19 with the movable member 21 is achieved. On the contrary, after positioning the circular cylindrical member 19 and the movable member 21 and under the condition of contracting the movable member 21 as mentioned above, when the spring 20 is in a free state the circular cylindrical member 19 and the movable member 21 become as shown in FIG. 4. It is therefore clear that the assembly and adjustment work can be accomplished very easily.

Although an embodiment, as shown in FIG. 4, in which the connecting or disconnecting of the circular cylindrical member 19 and the movable member 21 is performed, by utilizing the expansion and contraction of the spring 20, such a procedure is not limited to that embodiment. It can be easily seen that other optional mechanisms may be adapted.

Furthermore, a pin hole is provided on the tip-end portion of the cylinder 2 and on the movable member 21, respectively, and a pin 22 is inserted and fixed therein. In such a manner, the movable member 21 can be kept in the state shown in FIG. 4 so that the movable member can be prevented from rotating or getting lost.

Furthermore, it may be possible to set up a plurality of connecting bars 18 on the rotating arm 10 at predetermined distances and in the direction of the rotating arm's radius. Another rotating arm 18' shown in FIG. 1 is a connecting bar set up on the rotating arm 10 in such the manner shown above. In such a construction, if the movable member 21, attached to the tip-end portion of the cylinder 2, works as already, mentioned the cylinder 2 can be connected with the optional desired connecting bar. Consequently, the rotating radius of the optical conductor cable's 1 light-emitting edge 1a can be made to the desired size. For instance, when the cylinder 2 is joined with the connecting bar 18', the rotation radius of the optical conductor cable's 1 light-emitting edge 1a can be made smaller compared with that of connecting it with the connecting bar 18.

If the joining position of the cylinder 2 is changed in such a manner, the rotating movement applied to the rotating arm 10 will be changed also. Therefore, in the embodiment shown in FIG. 1, a plurality of holes 10' for mounting the balancing weight 17 are bored into the rotating arm 10 at intervals of a predetermined distance and in the direction of the rotating arm's 10 radius. In such a construction, the position for mounting the balancing weight 17 will be adjusted in accordance with the position for connecting the cylinder 2 with the connecting bar 18 so as to obtain the most suitable balance state.

An embodiment of the light source device, according to the present invention, has been described heretofore. However, the embodiment just mentioned above shows a fundamental construction of the light source device, according to the present invention, in which the moving area of the light source is minimal.

In the present invention, it might be possible to construct a light source device capable of being moved within a wider area on because the light source device would consist of the afore-mentioned, fundamental construction. In FIG. 1, 30 is a carrying table for carrying the light source device as mentioned above, 31 is a supporting leg for supporting the carrying table 30, 32 is a pin for fixing the carrying table 30 on the supporting leg 31, so as to support the former rotatably in the direction shown by arrow C, 33 is a semi-circular gear which is unitarily combined with the carrying table 30, and 34 is a gear engaged with gear 33.

When the gear 34 is rotated by a motor not shown in FIG. 1, the carrying table 30 moves shakily around the pin 32 in the direction as shown by arrow C, namely in an up and down direction. Consequently an up and down movement as shown by arrow D is added to the afore-mentioned circular movement at the light-emitting edge 1a of the optical conductor cable 1. 40 is a supporting base plate for supporting the afore-mentioned supporting leg 31. If the supporting base plate 40 is further supported so as to rotate on a fixed foundation 50, the entire portion of the afore-mentioned mechanism rotates around the supporting leg 31, and a rotational movement, in the direction as shown by arrow E, is added to the afore-mentioned movements at the light-emitting edge 1a of the optical conductor cable 1 so that the area of the movement at the light-emitting edge 1a may become wider. Furthermore, in FIG. 1, 51 is a rail for rotatably supporting the base plate 40. In such a case, the supporting base plate 40 is rotated by a motor.

Figure 5:
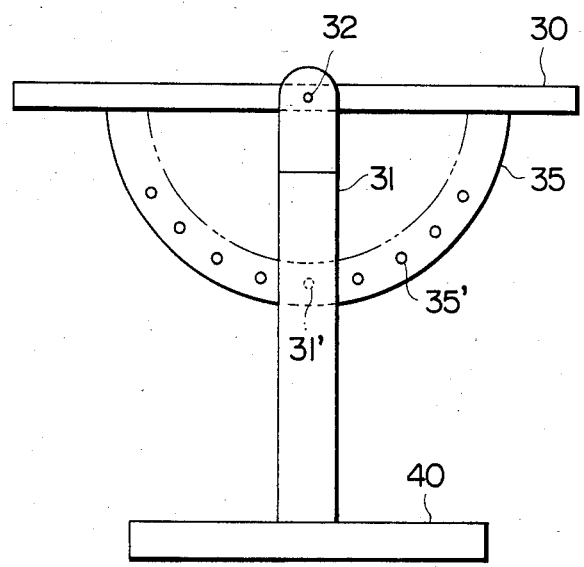
FIGS. 5 and 6 are construction views of the main portion for showing another embodiment of a mechanism mounted on the carrying table 30 so as to rotate around a horizontal axis.
Figure 6:
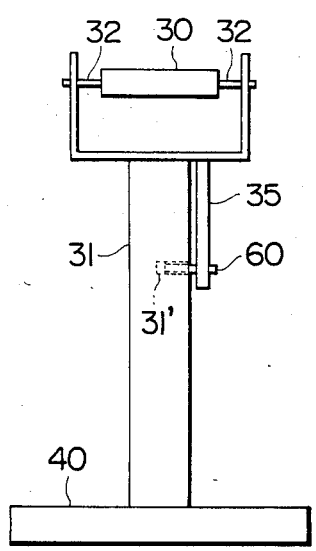

FIG. 5 is a side, elevational view of the main portion for explaining another embodiment which is mounted on the carrying table 30 so as to rotate around a horizontal axis (the pin 32). FIG. 6 is a front view thereof. In the embodiment as shown in FIGS. 5 and 6, the rotational position of the carrying table 30 can be adjusted by hand without employing any motive power like a motor. This simplifies the device and reduces the manufacturing cost.

Further, a semi-circular arm 35 for adjusting the amount of rotational movement can be mounted under the carrying table 30 instead of the afore-mentioned gear 33. A plurality of pin holes 35' can be bored on the semi-circular arm 35 at intervals of a predetermined distance. On the other hand, the supporting leg 31 can have a pin hole 31' bored at a place corresponding to the pin holes 35' mentioned above. The carrying table 30 can be rotated by hand around the axis of the pin 32 to the desired position so as to let the axis line of the pin hole 31' coincide with that of the pin hole 35'. When a pin 60 is inserted through the pin holes 31' and 35' in such a state as mentioned above, the carrying table 30 can be fixed at a position determined by inserting the pin 60 therethrough. Therefore, the carrying table 30 is so fixed as to incline to a desired angle in relation to the supporting leg 31.

Consequently, the carrying table 30 can be mounted on the supporting leg 31 so as to incline around a horizontal axis (the pin 32) at a desired angle by use of a simplified and low-cost construction, so that the direction for emitting the light rays from the light-emitting edge 1a of the optical conductor 1 can be rotated around the axis for rotating the carrying table 30 to a desired inclination angle.

Figure 7:
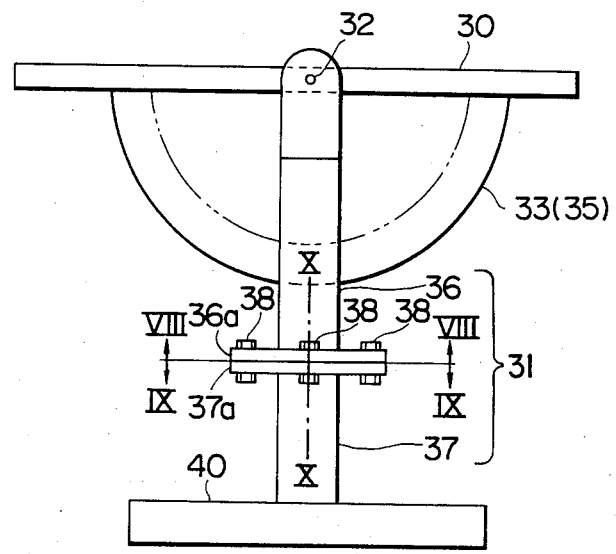
FIGS. 7 through 10 are construction views of the main portion for showing still another embodiment of a mechanism mounted on the carrying table 30 so as to rotate around a vertical axis.
Figure 8:
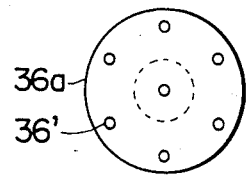
Figure 9:
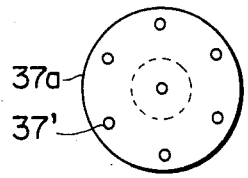

FIG. 7 is a side elevational view of the main portion for explaining still another embodiment of a mechanism mounting the carrying table 30 thereon so as to rotate around the vertical axis. FIG. 8 is a cross-sectional view as seen from the top along line VIII—VIII of FIG. 7. FIG. 9 is a cross-sectional view as seem from the bottom along line IX—IX of FIG. 7. In the embodiment as shown in FIGS. 7 through 9, the aforementioed supporting leg 31 is divided into a rotatable supporting leg 36 and a fixed supporting leg 37. These supporting legs 36 and 37 are joined to each other at the flange portions 36a and 37a. On that occasion, the other supporting leg 36 can be rotatably moved around the vertical axis of the other supporting leg 37 by changing position where they join.

A plurality of bolt holes 36' and 37' for joining support legs 36 and 37 are bored respectively at the flange portions 36a and 37b thereof. The supporting leg 36 is rotated to a desired angle in relation to the supporting leg 37 so as to position bolt hole 36' onto bolt hole 37'. Keeping to the above conditions, a plurality of bolts 38 are inserted through the bolt holes 36' and 37' and fastened by use of nuts or the like. In such a manner, the carrying table 30 can be fixed onto the foundation in such a way that the supporting leg 36 is rotated around the vertical axis of the supporting leg 37 at a desirable angle.

Figure 10:
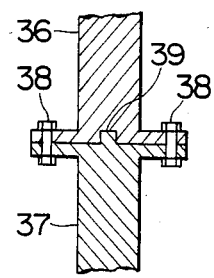

Furthermore, FIG. 10 is a cross-sectional view taken along section line X—X of FIG. 7. In FIG. 10, 39 is a pin for connecting the center of supporting leg 36 with that of supporting leg 37. In the case of rotating support leg 36 around the axis of supporting leg 37, if supporting leg 36 is rotated in such a way that both of the supporting legs 36 and 37 are rotatably fixed by use of pin 39, the central axis of supporting leg 36 doesn't deviate at all from that of supporting leg 37. Therefore, the work of positioning the bolt holes 36' and 37' can be performed very easily.

Consequently, according to the embodiment, the carrying table 30 can be adjusted by hand so as to rotate around a vertical central axis and can stop in an optional desired position so that the direction of light emissions from the light-emitting edge 1a of the optical conductor 1 can be rotated around the axis in an optional direction which is perpendicular to the central axis of the supporting leg 36 by use of a simplified and low-cost construction.

Moreover, in the case of constructing the supporting leg 31 with supporting legs 36 and 37 so as to rotate between them, it is not necessary to make the supporting base plate 40 for setting up those supporting legs rotatable on a fixed foundation 50.

As is apparent from the foregoing description, according to the present invention, the light rays emitted from the edge surface of the optional conductor can be effectively dispersed and supplied to plants so that the growth of the plants can be effectively promoted, and furthermore light rays can be supplied to a wider area.

I claim:

1. A light source device comprising a hollow cylinder, a support pin member for supporting said cylinder such that the cylinder can oscillate about a first axis perpendicular to a central axis of said cylinder, a pedestal member pivotably supporting said support pin member, a fixed supporting member for supporting said pedestal member such that the pedestal member can oscillate about a second axis intersecting with the central axis of said cylinder and intersecting said first axis, a driving mechanism for oscillating said cylinder around said first axis and said second axis at a first end of said cylinder, and an optical conductor cable inserted into said cylinder at a place near to said first axis, said cable extending within said cylinder from said place near to said first axis to an end portion of the cylinder opposite said first end.

2. A light source device as defined in claim 1, wherein said driving mechanism comprises a motor and a rotating arm which is rotated by said motor, said rotating arm having a first end with a connecting bar elongated therefrom in a direction substantially parallel to the central axis of the cylinder, and an edge portion of said connecting bar is rotatably connected with said cylinder therein at said first end of said cylinder.

3. A light source device as defined in claims 1 or 2, wherein said cylinder is provided with a moveable member at said first end of said cylinder, said moveable member being constructed so as to extend and retract relative to said cylinder.

4. A light source device as defined in claim 2, wherein a plurality of said connecting bars are provided in a radial direction of said rotating arm.

5. A light source device as defined in either one of claims 2 or 4, wherein said rotating arm has a balancing weight attached diametrically opposite said first end of said rotating arm.

6. A light source device as defined in claim 5, wherein said balancing weight is movable in the radial direction of said rotating arm.

7. A light source device comprising a hollow cylinder, a support pin member for supporting said cylinder such that the cylinder can oscillate about a first axis which is perpendicular to a central axis of said cylinder, a pedestal member pivotably supporting said support pin member, a fixed supporting member for supporting said pedestal member, such that said pedestal member can oscillate about a second axis intersecting with the central axis of said cylinder and with said first axis, a driving mechanism for oscillating said cylinder around said first axis and said second axis at a first end of said cylinder, a carrying table for carrying said fixed supporting member and said driving mechanism, a support mechanism for pivotably supporting said carrying table, and an optical conductor cable inserted into said cylinder at a place near to said first axis, said cable extending within said cylinder from said place near to said first axis to an end portion of the cylinder opposite said first end.

8. A light source device as defined in claim 7, wherein said supporting mechanism comprises a rotating support leg which is connected with said carrying table and a fixed supporting leg fixedly mounted on a foundation, both of said supporting legs being connected with each other through a flange portion, said flange portion having a plurality of bolt holes for connecting said rotating support leg and said fixed supporting leg with said flange portion, said rotating support leg being rotatable in relation to said fixed supporting leg by changing the relative position of said bolt holes to be connected.

9. A light source device as defined in claim 7, wherein said carrying table pivots around a horizontal axis.

10. A light source device as defined in claim 9, wherein the amount of pivoting of said carrying table is adjusted by the use of a motor.

11. A light source device as defined in claim 9, wherein said support mechanism comprises an arm for adjusting the amount of pivoting and a supporting leg, said arm having pin-receiving holes bored therein at intervals of a predetermined distance, said supporting leg having a pin-receiving hole said pin-receiving holes of said arm being employed for adjusting the pivoting of said carrying table in relation to said pin-receiving hole of said support leg.

12. A light source device as defined in claim 11, wherein said supporting leg is constructed so as to rotate around a vertical axis.

* * * * *